(12) United States Patent
Snethen et al.

(10) Patent No.: US 7,587,646 B1
(45) Date of Patent: Sep. 8, 2009

(54) TEST PATTERN GENERATION IN RESIDUE NETWORKS

(75) Inventors: Thomas James Snethen, Endwell, NY (US); Carolyn Asher, Endicott, NY (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 12/143,043

(22) Filed: Jun. 20, 2008

(51) Int. Cl.
*G06F 11/00* (2006.01)

(52) U.S. Cl. ...................................... 714/738; 714/727

(58) Field of Classification Search .................. 708/491, 708/650; 714/726, 728, 729, 727, 738
See application file for complete search history.

(56) References Cited

U.S. PATENT DOCUMENTS

| | | | | |
|---|---|---|---|---|
| 4,555,769 A | * | 11/1985 | Carter et al. | 708/491 |
| 5,499,202 A | * | 3/1996 | Takahashi et al. | 708/650 |
| 6,594,789 B2 | * | 7/2003 | Whetsel | 714/727 |
| 6,611,933 B1 | | 8/2003 | Koenemann et al. | |
| 7,281,183 B2 | * | 10/2007 | Whetsel | 714/727 |
| 2007/0294606 A1 | * | 12/2007 | Whetsel | 714/727 |
| 2008/0288840 A1 | * | 11/2008 | Whetsel | 714/727 |

OTHER PUBLICATIONS

D. C. Bossen, D. L. Ostapko, A. M. Patel, M. S. Schmookler: Minimum Test Patterns for Residue Networks; International Business Machine Corporation; pp. 278-284; 1971, ACM Press.

* cited by examiner

*Primary Examiner*—David Ton
(74) *Attorney, Agent, or Firm*—Rosenberg, Klein & Lee

(57) ABSTRACT

Generating a near-minimal test pattern set for overlapping residue circuit trees in a residue network includes resolving a residue function of residue circuits through the network and making note of any gate at which the residue function thereof does not produce the assigned vector output for a given assigned set of input vectors. Where such gates cannot be resolved during one set of vector assignments, the test set that is complete up to the offending gate may be saved, and resolution of the residue function may be started from another node in the network. Multiple test sets may be generated, the combined application of which will exhaustively test each gate in the network.

28 Claims, 10 Drawing Sheets

| NAME | VECTOR |
|---|---|
| a | 0 1 1 0 0 1 1 0 0 1 1 0 0 1 1 0 |
| b | 0 1 0 1 0 1 0 1 0 1 0 1 0 1 0 1 |
| c | 0 0 1 1 0 0 1 1 0 0 1 1 0 0 1 1 |
| d | 0 0 0 0 1 1 1 1 0 0 0 0 1 1 1 1 |
| e | 0 1 1 0 1 0 0 1 0 1 1 0 1 0 0 1 |
| f | 0 1 0 1 1 0 1 0 0 1 0 1 1 0 1 0 |
| g | 0 0 1 1 1 1 0 0 0 0 1 1 1 1 0 0 |
| h | 0 0 0 0 0 0 0 0 1 1 1 1 1 1 1 1 |
| i | 0 1 1 0 0 1 1 0 1 0 0 1 1 0 0 1 |
| j | 0 1 0 1 0 1 0 1 1 0 1 0 1 0 1 0 |
| k | 0 0 1 1 0 0 1 1 1 1 0 0 1 1 0 0 |
| l | 0 0 0 0 1 1 1 1 1 1 1 1 0 0 0 0 |
| m | 0 1 1 0 1 0 0 1 1 0 0 1 0 1 1 0 |
| n | 0 1 0 1 1 0 1 0 1 0 1 0 0 1 0 1 |
| o | 0 0 1 1 1 1 0 0 1 1 0 0 0 0 1 1 |
| zeros | 0 0 0 0 0 0 0 0 0 0 0 0 0 0 0 0 |

| PATTERN NUMBER | I1 | I2 | I3 | I4 | I5 | I6 |
|---|---|---|---|---|---|---|
| 1 | 0 | 0 | 0 | 0 | 0 | 0 |
| 2 | 1 | 1 | 0 | 0 | 1 | 1 |
| 3 | 0 | 1 | 0 | 1 | 1 | 0 |
| 4 | 1 | 0 | 0 | 1 | 0 | 1 |
| 5 | 1 | 0 | 1 | 0 | 0 | 0 |
| 6 | 0 | 1 | 1 | 0 | 1 | 1 |
| 7 | 1 | 1 | 1 | 1 | 1 | 0 |
| 8 | 0 | 0 | 1 | 0 | 0 | 1 |
| 9 | 0 | 0 | 0 | 0 | 0 | 0 |

FIG. 7A

| PATTERN NUMBER | I1 | I2 | I3 | I4 | I5 | I6 |
|---|---|---|---|---|---|---|
| 1 | 0 | 0 | 0 | 0 | 0 | 0 |
| 2 | 1 | 1 | 0 | 0 | 1 | 1 |
| 3 | 1 | 1 | 1 | 1 | 1 | 1 |
| 4 | 0 | 0 | 1 | 1 | 0 | 1 |
| 5 | 1 | 0 | 1 | 1 | 0 | 0 |
| 6 | 0 | 1 | 1 | 1 | 1 | 1 |
| 7 | 0 | 1 | 0 | 1 | 1 | 0 |
| 8 | 1 | 0 | 0 | 0 | 0 | 1 |
| 9 | 0 | 0 | 0 | 0 | 0 | 0 |

FIG. 7B

TEST PATTERN GENERATION IN RESIDUE NETWORKS

BACKGROUND OF THE INVENTION

1. Field of the Invention

The present general inventive concept is related to test pattern generation in circuit testing. More specifically, the general inventive concept generates test patterns for residue networks that include overlapping logic cones, varying fan-in, and reconvergent fan-out of its constituent residue circuits.

2. Description of the Related Art

A residue network, as used herein, is a network of one or more logic trees of interconnected residue circuits, alternatively referred to herein as "gates," each of which computes a residue function, generally the modulo-m sum of its inputs. Such residue networks are used in a wide range of applications, including parity and error correction circuits, and the spreader and compression networks of standard scan configurations of test circuits embedded in primary functional circuitry. A schematic block diagram of such a test circuit 100 is illustrated in FIG. 1. Typically, the test circuit 100 utilizes modulo-2 residue circuits, which may be implemented by binary exclusive-OR (XOR) gates. The scan chains 110-112 are typically constructed as serially connected state retention components, such as flip-flops, that provide test data to the primary functional circuitry and convey response data out of the test circuit 100. An XOR tree configuration is provided at the inputs of the scan chains 110-112 in what is often referred to as a "spreader" network 120, and another XOR tree configuration is provided at the output side of the scan chains 110-112 in what is generally referred to as a "compression" network 130.

As illustrated in FIG. 1, the number of scan chains in the conventional test circuit is $N_C$, the number of scan data input terminals $N_I$, and the number of scan data output terminals $N_O$, where $N_I<N_C$ and $N_O<N_C$. Typically, $N_I=N_O$ for convenience in assigning and conserving input/output (I/O) terminals, which may be shared by using bidirectional I/O circuits. Thus, the spreader network 120 consists of $N_C$ XOR trees, each driven by some subset of the $N_I$ scan data inputs, and the compression network 130 consists of $N_O$ XOR trees, each driven by some subset of the $N_C$ scan chain outputs. The spreader network 120 and the compression network 130 thus minimize the amount of test data that must be scanned into and out of the scan chains 110-112, so that smaller numbers of scan data input terminals and scan data output terminals are needed. Test data are input onto the $N_I$ input terminals, where they are decompressed in the spreader network 120, are shifted as decompressed test data through the scan chains 110-112, where they are introduced to the circuit to be tested. Response data are obtained and are subsequently compressed in the compression network 130, and the compressed data are output on the $N_O$ output terminals. Additional circuitry may be used, such as a multiple-input signature register (MISR; not illustrated), to further compress the data at the output of the scan chains 110-112.

Traditional scan chain testing, however, does not exercise the residue circuitry in the spreader/compression networks to the extent that these networks are known to be fault-free. Without the knowledge of whether the compression/decompression logic contains faults, detected faults in subsequent logic testing cannot easily be diagnosed. Moreover, the testing of the circuitry is preferably to be carried out using a minimal number of test patterns so that circuit testing consumes less time.

One technique that considers the minimal number of tests as preferential is to note any faults within the compression and decompression logic uncovered during scan chain testing so that those faults are not targeted by the logic tests. With this solution, the expectation is that the scan processes performed during the application of the logic tests would serendipitously detect any failures within the compression and decompression logic. However, since this technique does not identify faults in the compression and decompression networks separately from those of the logic under test, the diagnosis of logic test failures is made even more arduous than it already is.

Another conventional technique is to repeat the scan chain test using random vectors. This approach has a disadvantage that a fixed number of random patterns cannot guarantee detection of all the faults within the compression and decompression logic. Although this can be overcome by monitoring the fault coverage through simulation of the tests and stopping when all the faults have been detected, this random-pattern approach results in an exorbitant number of tests.

Test pattern generation techniques applicable to general residue networks exist, and may be applied to generate test pattern sets for certain restricted residue architectures. However, these general techniques are limited as to their applicability to practical circuits, such as when the residue network contains varying fan-in (the set of input paths to a particular gate) among its constituent components, and/or when the residue network contains reconvergent fan-out (the set of output paths from a gate). Thus, the need has been felt for methods and apparatuses that generate minimal sets of test patterns to test residue networks containing overlapping logic, varying fan-in and reconvergent fan-out, such as in the compression/decompression networks in a test circuit.

SUMMARY OF THE INVENTION

The present general inventive concept provides test pattern generation to existing scan chain tests to cover not only the scan chains themselves, but also the decompression logic feeding the scan chains and the compression logic between the scan chain outputs and the primary outputs of the circuit. The present general inventive concept achieves this in such a way as to not only reduce the number of test patterns generated, but to improve the diagnostics of logic test failures.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept may be achieved by providing a method of generating test pattern sets to test a network of residue circuits. Bit vectors are determined that resolve a residue function of respective residue circuits in a logic cone of a processor-readable representation of the network. At least one vector of the vector solutions is applied to the vector solution of one of the residue circuits in an overlapping logic cone of the network, and the vector solutions are propagated through the logic cone and the overlapping logic cone to the inputs of the network by resolving the residue function of intervening residue circuits. The bit vectors propagated to the inputs of the network are stored as the test pattern sets.

The foregoing and/or other aspects and utilities of the present general inventive concept may also be achieved by providing a method of generating test pattern sets that generates a set of bit vectors to apply to input terminals of the network such that every gate in logic cones thereof is driven by all possible input values, where the gates include at least one gate having a number of input terminals different than the number of input terminals of another of the gates. One of the bit vectors is assigned to an output of the network and the residue function of the gate connected thereto is resolved with the assigned one of the bit vectors. The bit vectors resolved at the output gate are propagated to the gates respectively connected thereto, and the residue function of the connected gates is resolved using the bit vectors propagated thereto. The propagating and the resolving of the gates are repeated to assign input bit vectors to the input terminals of the network, which are stored as the test pattern sets.

The foregoing and/or other aspects and utilities of the present general inventive concept may also be achieved by providing a circuit test design apparatus to generate test patterns to test residue networks. The apparatus includes a database to store a processor-readable representation of the residue network, a vector set generator to generate an ordered set of bit vectors according to a maximum number of input terminals expected in the residue network, and a storage unit to store therein the bit vectors. The apparatus includes a processor to determine sets of bit vectors that resolve a residue function of respective residue circuits in a logic cone of the network, to assign at least one vector of the resolved residue functions to one of the residue circuits in an overlapping logic cone of the network, to propagate the bit vectors through the logic cone and the overlapping logic cone to the inputs of the network by resolving the residue function of intervening residue circuits with the vectors propagated thereto, and to store the bit vectors propagated to the inputs of the network in the storage unit as the test pattern sets.

The foregoing and/or other aspects and utilities of the present general inventive concept may also be achieved by providing a test circuit to test a functional circuit, the test circuit including a residue network to produce a plurality of bit patterns according to residue circuits thereof, and a plurality of scan chains embedded in the functional circuit and coupled to the residue network, the scan chains having stored therein bit patterns corresponding to a functional test of the residue network performed separately from the test of the functional circuit.

BRIEF DESCRIPTION OF THE DRAWINGS

These and/or other aspects and utilities of the present general inventive concept will become apparent and more readily appreciated from the following description of the embodiments, taken in conjunction with the accompanying drawings, of which:

FIGS. 7A and 7B are input patterns to be applied to the exemplary circuit of FIG. 4 as determined by an exemplary embodiment of the present general inventive concept.

DETAILED DESCRIPTION OF THE PREFERRED EMBODIMENTS

Figure 1:
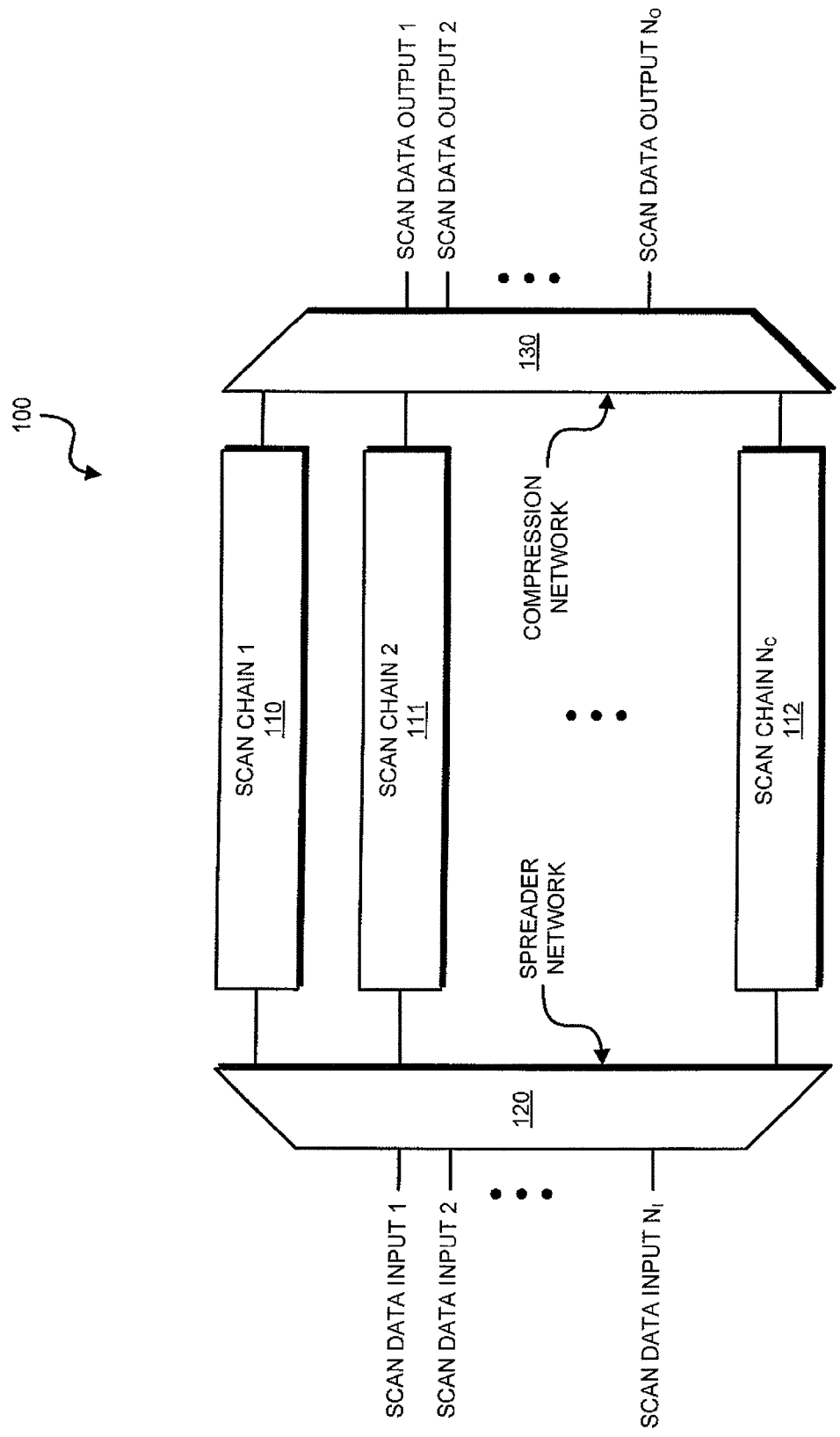
FIG. 1 is a schematic block diagram of an exemplary embedded test circuit to demonstrate one practical application of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Figure 2A:
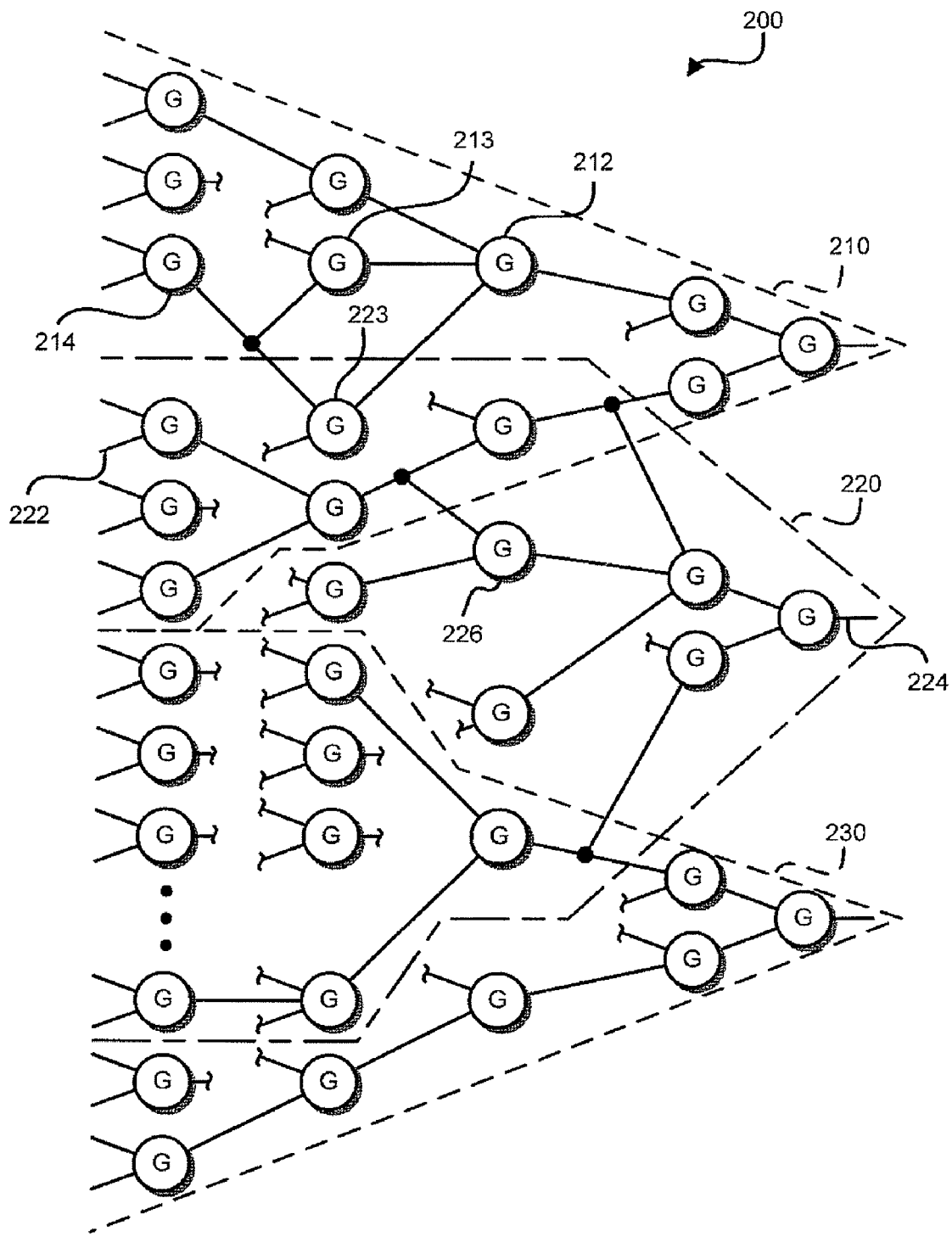
FIGS. 2A-2B are tree graphs illustrating overlapping logic cones and reconvergent fan-outs testable by way of the present general inventive concept.
Figure 2B:
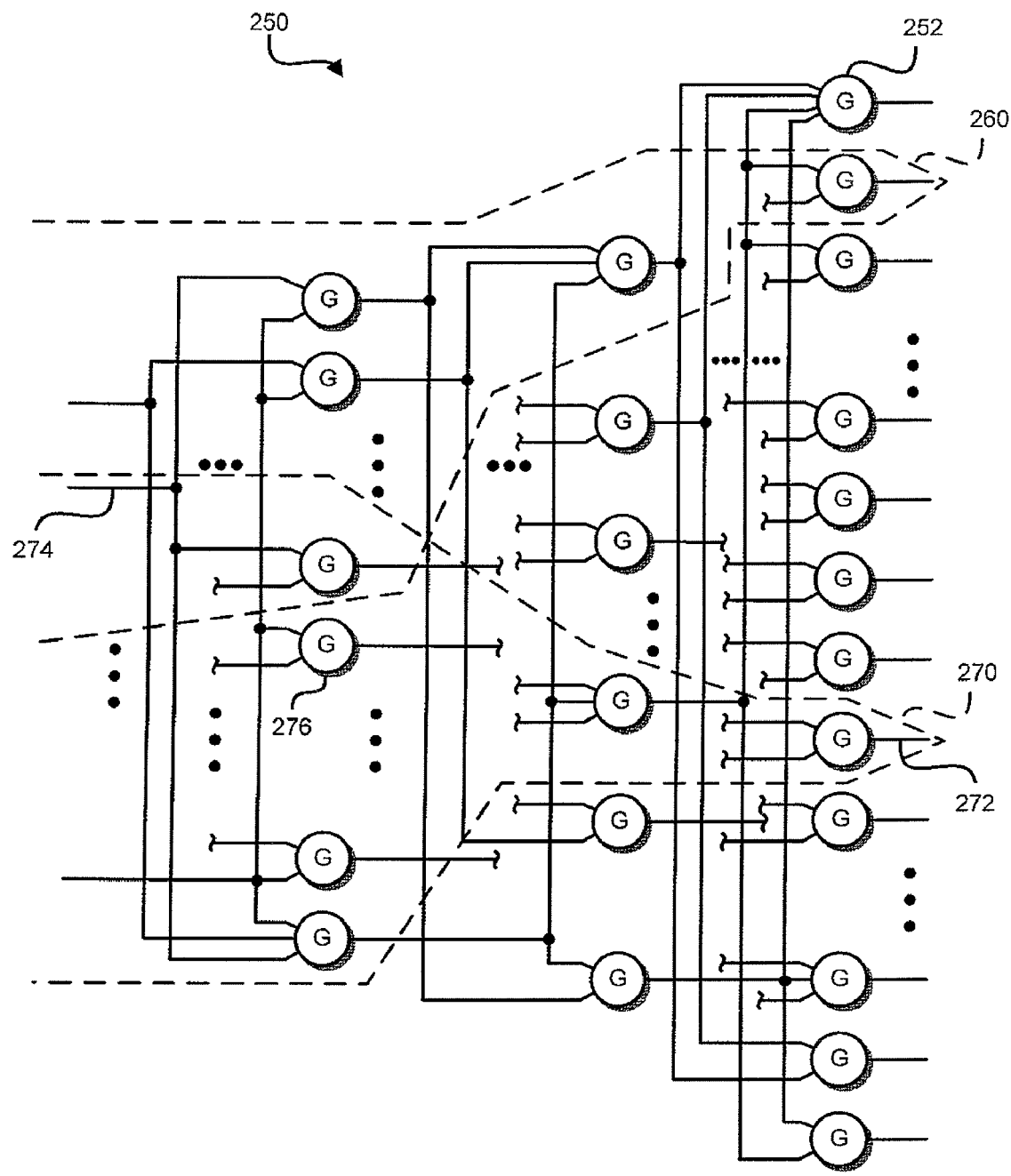

As illustrated in FIG. 2A, a residue network 200 may be constructed from a plurality of logic trees of residue circuits, or "gates," such as illustrated at gates 212-214. Each of the residue circuits 212-214 produces at the output terminal thereof a modulo-m sum of the data provided at the input terminals thereof. FIG. 2B illustrates an alternative configuration of a residue network 250, where the residue network 200 in FIG. 2A may be a compression network and the residue network 250 in FIG. 2B may be a spreader network. The residue networks 200 and 250 may be interconnected by scan chains, such as is illustrated in FIG. 1.

Each residue network 200, 250 may have defined therein a plurality of logic cones, such as illustrated at logic cones 210, 220, and 230 in FIG. 2A, and logic cones 260 and 270 in FIG. 2B. As used herein, a "logic cone" is all of the logic gates that exists between a single residue tree output and the inputs that drive the logic in that tree. For example, logic cone 220 in FIG. 2A is rooted at output 224 and includes all of the gates within the dashed line to the driving inputs, representatively illustrated at input 222. Similarly, in FIG. 2B, the logic cones 260 and 270 are driven from inputs, representatively illustrated at input 274, through the gates of the tree, representatively illustrated at gate 276, and ultimately to an output, representatively illustrated at output 272. As is illustrated in FIGS. 2A-2B, logic cones of the residue networks 200, 250 may overlap to share not only the same inputs, but also to share certain gates. The present general inventive concept generates test data to exhaustively exercise the gates in a residue network having such overlapping logic cones, where such exercise applies all possible input patterns to each gate.

In contradistinction with other residue network testing techniques, the present general inventive concept is not limited to residue networks that are constructed of gates having like fan-in or to those that exclude reconvergent fan-out. For example, it is to be noted that gates 214 and 212 in FIG. 2A compute the residue of two input variables and three input variables, respectively, whereas gates 276 and 252 in FIG. 2B compute the residue of two input variables and four input variables, respectively. Additionally, it is to be noted that the output of gate 214 in FIG. 2A is coupled to gate 212 through two separate paths forming a reconvergent fan-out; a first path is defined through gate 223 and a second path is defined through gate 213. The present general inventive concept affords fault testing of such residue network configurations.

In accordance with embodiments of the present general inventive concept, multiple test patterns are generated from network configuration data, such data structures defining a circuit schematic, that, when applied to the input terminals of the network, provide all possible input patterns to each gate in the network. The resolution of the patterns may be achieved by resolving the residue function at the gates with bit vectors, and propagating the vector solutions through the network to the input terminals thereof. If a gate is encountered at which the residue function thereof cannot be resolved using the propagated vectors, the vectors having been propagated to the inputs can be saved as a test set, and propagation of the bit vectors may be started from another node in the network. Multiple test sets may be thus generated, the combined application of which will exhaustively test the gates in the network with a near-minimal set of test patterns.

For purposes of description, but not limitation, the exemplary embodiments to be described are constructed from residue circuits that perform a modulo-2 sum operation, denoted herein by XOR(a, b, . . . , m), where the argument is a plurality of bit vectors provided at the input terminals of the gate. XOR circuits are widely used in the circuits previously described, and thus serve as a suitable exemplary embodiment for purposes of description. However, the ordinarily skilled artisan will recognize that gates implementing other than modulo-2 summing networks may be used with the present general inventive concept without departing from the spirit and intended scope thereof.

In certain embodiments of the present general inventive concept, the resolution of the residue function is achieved through a set of binary vectors of bit patterns that, when combined with other vectors in the set, exhaustively exercise individual gates according to the number of inputs to the gate. For example, the set of vectors may be generated as an ordered set of bit sequences such that the set for a maximum fan-in of n−1, having $|S_{n-1}|$ members consists of the first $|S_{n-1}|$ members of $S_n$, the vector set for a maximum fan-in of n, with each vector being truncated to the appropriate length ($2^{n-1}$). The number of vectors in the set is based on the maximum gate fan-in that is expected in the network, which for modulo-2 summation, may be $2^n$ vectors, where n is the maximum fan-in in the network. The vector set must be "closed," that is, the residue function of any set of unique vectors (no vector is repeated) is a vector belonging to the set. The length of each vector and the size of the set will increase with the maximum number of gate fan-ins.

As is readily recognized by the ordinarily skilled artisan, a residue circuit may be constructed from multiple sub-circuits interconnected to implement the residue function. For example, a modulo-2 XOR function may be realized by prudent interconnection of AND, OR, NAND and NOR circuits. In certain embodiments of the present general inventive concept, the XOR residue function is resolved at each gate in the residue circuit, regardless of its particular function within the residue circuit. The ordinarily skilled artisan may find this approach to be counterintuitive, however, in those cases where the present general inventive concept is practiced solely to derive test patterns that apply all possible input combinations to the residue circuit as a whole, the inventors have established that the foregoing technique has a high rate of success without the additional computational overhead of determining the function of every gate encountered, and then resolving the particular logic function that was determined.

Similarly, in certain embodiments of the present general inventive concept, inversions within the residue network are ignored. Inverting the inputs of an XOR gate, for example, has the same effect as inverting its output, and inverting the output of an XOR gate does not affect the input vectors needed to exhaustively exercise each residue circuit in the network. Thus, in those cases where the present general inventive concept is practiced solely to derive input patterns that apply all possible input combinations to the residue circuit as a whole, the inversions in the network can be safely ignored. Otherwise, if the output patterns are to be derived, any vector in the vector set could be bitwise inverted and a new closed set of bit vectors may be constructed accordingly, in accordance with the description below.

Figure 5A:
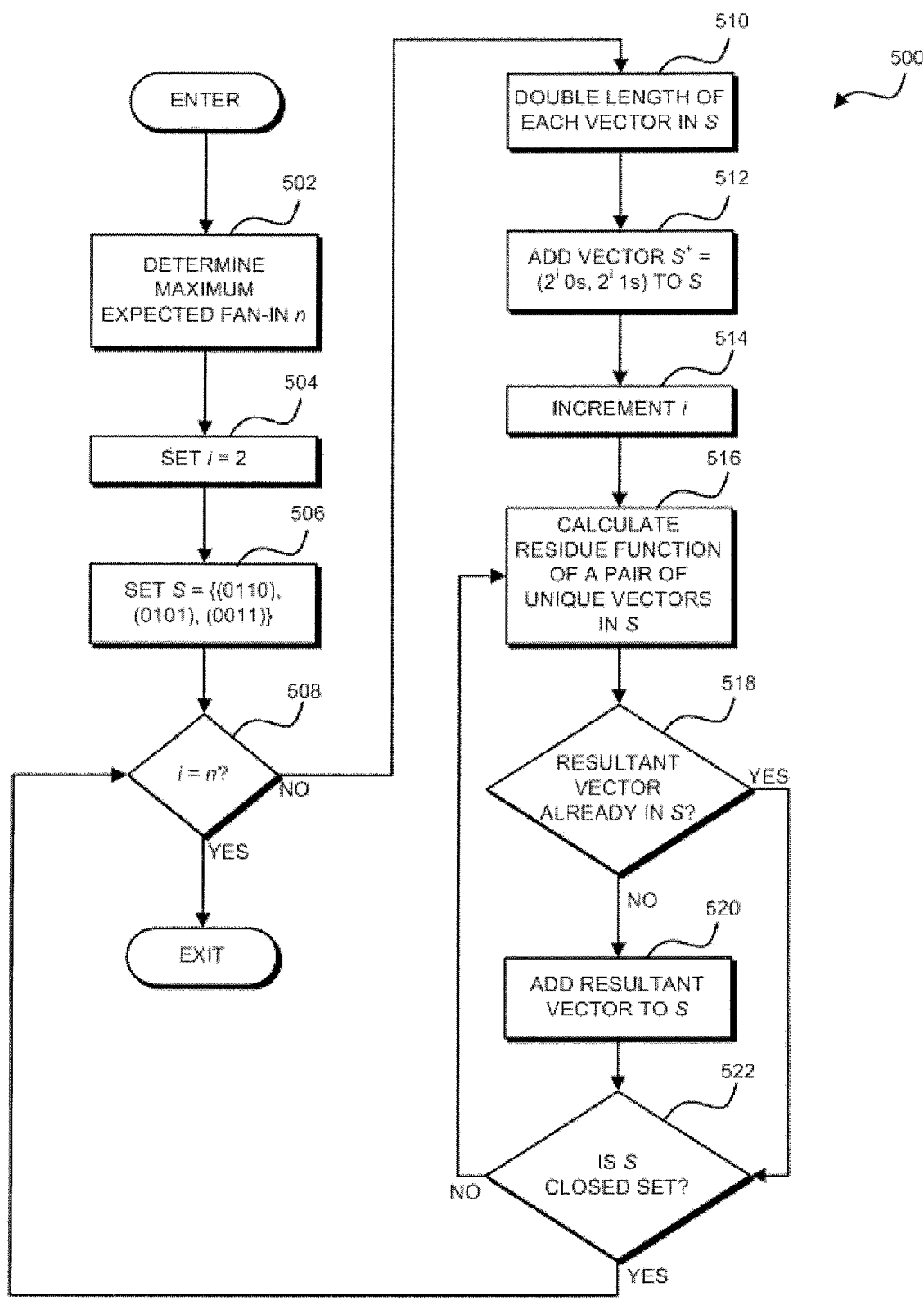
FIG. 5A is a flowchart to illustrate an exemplary process by which an ordered set of vectors may be generated in accordance with certain embodiments of the present general inventive concept.

FIG. 5A illustrates a flowchart of an exemplary process 500 by which a vector set such as that defined above may be generated. It is to be understood that while the process 500 is directed to a network of variable fan-in modulo-2 residue circuits, similar processes may be used to generate vector sets for networks of general modulo-m gates in certain embodiments of the present general inventive concept. Additionally, processes other than that illustrated in FIG. 5A and described below may be used to generate a modulo-2 vector set without departing from the spirit and intended scope of the present general inventive concept.

As illustrated in FIG. 5A, the exemplary process 500 begins at operation 502 with determining the maximum fan-in n of the residue network being scrutinized. This number may be obtained from information contained in the database storing the residue network information, such as the database 380. The exemplary process 500 transitions to operation 504, whereby an index i is initialized to correspond to a maximum fan-in of two (2), which is also the minimum fan-in of a residue circuit. In operation 506, the vector set S is initialized with a closed vector set corresponding to residue circuits having a maximum fan-in of two (2), i.e., any two of the vectors in S will produce the remaining vector. In operation 508, it is determined whether the index i is equal to the maximum fan-in n. If so, the process terminates, but, if not, the process transitions to operation 510, whereby the length of each vector in S is doubled, such as by appending a copy of all of the bits in each vector onto itself. That is, the length of the vector $(v_1, v_2, \ldots, v_i)$ may be doubled to form the vector $(v_1, v_2, \ldots, v_i, v_1, v_2, \ldots, v_i)$. The process 500 transitions to operation 512, whereby a vector $S^+$ is added to the vector set S. The vector $S^+$ may be formed by, for example, appending $2^i$ zero bits with $2^i$ one bits. In operation 514, the index i is incremented by one (1). The exemplary process 500 then proceeds to operation 516, whereby the residue function is performed on each pair of unique vectors in S. In operation 518, it is determined whether the vector resulting from the residue function is already contained in the set S. If not, the vector is added to S in operation 520, where if the vector is already in S, operation 520 is skipped. The exemplary process 500 proceeds to operation 522, where it is determined whether S is a closed set. If not, the process 500 iterates from operation 516 using a different unique pair of vectors. If the set S is closed, the process iterates from operation 508 to determine whether the vector set S is complete for the maximum fan-in n of the residue network under scrutiny.

Figure 5B:
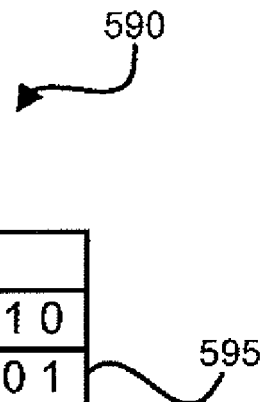
FIG. 5B is an exemplary ordered set of vectors generated by the exemplary process of FIG. 5A to be assigned to residue circuits in certain embodiments of the present general inventive concept.

A vector set 590 for n=4 is illustrated in FIG. 5B, where a representative vector is illustrated at vector 595. As shown in FIG. 5B, the final vector set 590 includes a vector of all 0's as the last vector in the set. In most circumstances, the all 0's vector will not be needed during test pattern generation, but this vector may be needed if, for example, reconvergent paths cause both inputs of a two-input XOR gate to be assigned the same vector. In such cases, the zeros vector would be assigned to the XOR gate so that the vector assignment process from the inputs to the residue network can run to completion. However, the XOR gate having the zeros vector assigned thereto and any residue circuit that it feeds would not be exhaustively tested without additional measures. In certain embodiments of the present inventive concept, the foregoing situation prompts an additional test generation cycle resulting in another test set to ensure that all possible transitions occur at each input terminal of the gate, as is described below.

As is described further below, the vectors in the vector set 590 are used to resolve the residue function of the gates in the network. The logic cones in the network may be backtraced, and the residue function of each gate may be resolved as it is encountered. In certain embodiments of the present general inventive concept, the rules for assigning vectors from the vector set 590 to an XOR gate are:

If all other terminals of the gate have been assigned vectors, the remaining terminal is assigned the XOR function of the vectors assigned to all the other terminals (Rule 1);

otherwise:

the first vector from the vector set 590 that is not in the gate's "unacceptable list" is chosen (Rule 2). The unacceptable list restricts future assignments to terminals on the gate; it does not mean that the assignment already made was unacceptable. A vector assigned to any other terminal on the gate is unacceptable, and the vector resulting from the XOR function of each combination of all previously assigned terminals is unacceptable. The unacceptable vectors may be maintained in an unacceptable list in memory, as is described more fully below.

Description of vector assignment to resolve the residue function of a four-input gate will now be described using the 16-value vector set 590 with n=4. Taking the output of the gate as the starting point for a backtrace, the first vector assignment is made on the gate's output. Because this is the first assignment, all vectors are acceptable. Thus, the output is assigned the vector a, which is also added to the list of unacceptable vectors for the remaining terminals of the gate. At the first input of the gate, the only unacceptable vector is a, and accordingly, the vector b is assigned to the first input terminal. The XOR function of vector b with each vector in the unacceptable list for this gate is computed and added, along with vector b itself, to the unacceptable list. The unacceptable list then becomes {a, b, c}. The second input of the gate is thus assigned the vector d, the next acceptable vector in the vector set 590. Vector d and its XOR with all existing members of the unacceptable list are added to the unacceptable list, which for the remaining terminals is {a, b, c, d, e, f, g}. The third input is then assigned the vector h, and the unacceptable list becomes {a, b, c, d, e, f, g, h, i, j, k, l, m, n, o}. However, this list can be ignored, because the fourth input is the last terminal on the gate to be assigned, so Rule 2 does not apply. By Rule 1, the assignment of the fourth input is XOR(a, b, d, h)=o. The residue function of the gate is thus resolved, i.e., XOR(b, d, h, o)=a. The vectors that resolve the residue function at each gate are propagated to the terminals of the gates connected thereto, and the vector assignments are made in a similar manner to resolve the residue function at the connected gates. This is repeated until vectors are propagated to the network inputs, as described further below, where the assigned input vectors are referred to herein as a "test set." A test set includes several input patterns, each defined by a corresponding element of the vector assigned to that input.

In certain embodiments of the present general inventive concept, the unacceptable list for a gate is updated whenever the connection to one of its terminals is assigned. Thus, the processing of a gate always proceeds as described above, except that terminals which are already assigned are simply skipped. Additionally, due to the nature of the residue function, no distinction need be made between the treatment of the output and each of its inputs. That is, processing a gate may proceed by assigning a vector to its output and resolving the residue function by way of assigning the appropriate vectors to its inputs. However, the processing of a single gate works equally well if the assignments are made starting with an input terminal and resolving the residue function by assigning the appropriate vector to the output terminal last.

Figure 3A:
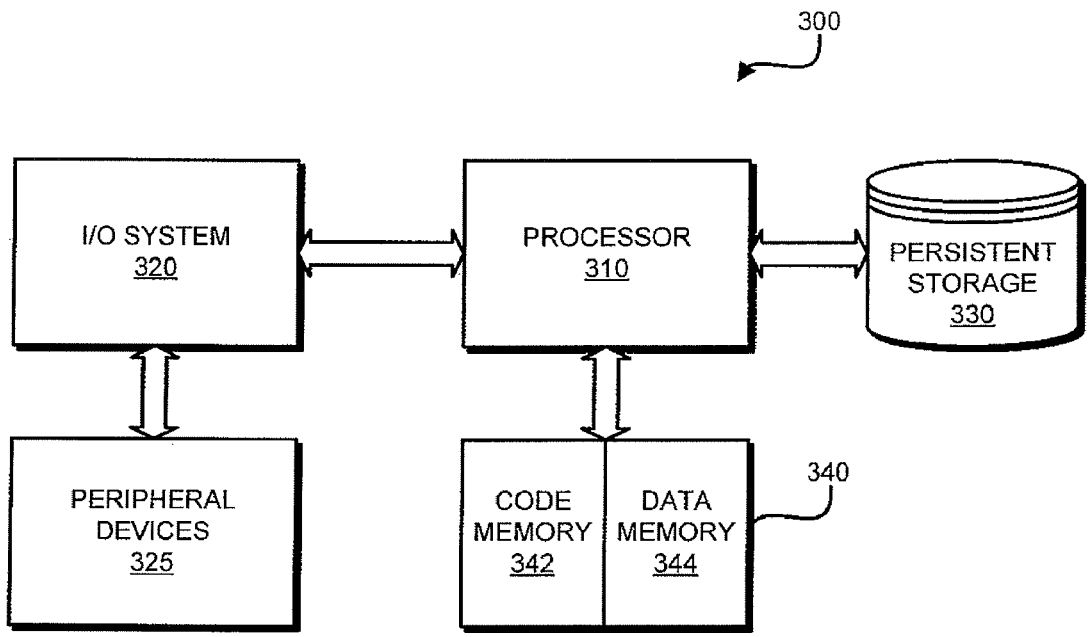
FIGS. 3A and 3B are schematic block diagrams of exemplary system configurations to carry out embodiments of the present general inventive concept.

FIG. 3A illustrates an exemplary embodiment of a system configuration suitable to practice the present general inventive concept. An exemplary data processing apparatus 300 includes an input/output (I/O) system 320, through which the data processing apparatus 300 may communicate with peripheral devices 325, and/or with external network devices (not illustrated). The exemplary data processing apparatus 300 of the embodiment illustrated in FIG. 3A includes a processor 310 to direct the interoperation of the components of the data processing apparatus 300, and to execute processing instructions that implement various functional modules, such as those described below with reference to FIG. 3B. Embodiments of the present general inventive concept are not limited to a particular hardware configuration or instruction set architecture of the processor 310, and may be configured by numerous structures that perform equivalently to those illustrated and described herein. Moreover, it is to be understood that while the processor 310 is illustrated as a single component, certain embodiments of the present general inventive concept include distributed processing implementations through multiple processing elements. The present general inventive concept is intended to embrace all such alternative implementations, and others that will be apparent to the skilled artisan upon review of this disclosure.

A storage unit 340 may be utilized to store data and processing instructions on behalf of the exemplary data processing apparatus 300 of FIG. 3A. The storage unit 340 may include multiple segments, such as a code memory 342 to maintain processor instructions to be executed by the processor 310, and data memory 344 to store data, such as data structures on which the processor 310 performs data manipulation operations. The storage unit 340 may include memory that is distributed across components, to include, among others, cache memory and pipeline memory.

The data processing apparatus 300 may include a persistent storage system 330 to store data and processing instructions across processing sessions. The persistent storage system 330 may be implemented in a single persistent memory device, such as a hard disk drive, or may be implemented in multiple persistent memory devices, which may be interconnected by a communication network.

It is to be understood that although the functional compartmentalization of the exemplary embodiment of FIG. 3A facilitates an understanding of the present general inventive concept through descriptions thereof, such configuration is not essential to practice the present general inventive concept. Elements other than those shown and described may be substituted therefor, functionality portrayed as carried out in multiple elements may be combined into a single component, and elements described as discrete may be distributed across multiple components. Indeed, numerous variations, alternatives and modifications will become apparent to the skilled artisan upon review of this disclosure and the present general inventive concept is intended to encompass such alternative configurations.

Figure 3B:
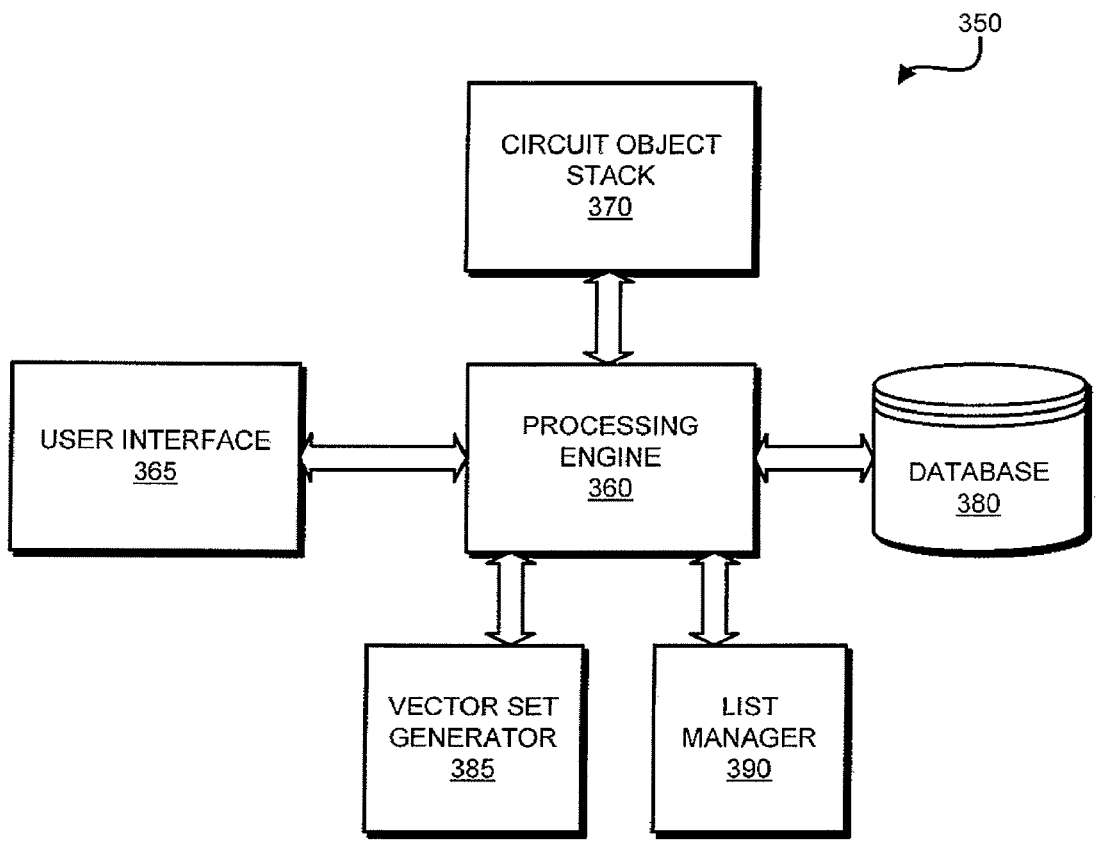

FIG. 3B illustrates an exemplary configuration of functional components suitable to practice certain embodiments of the present general inventive concept. The exemplary system illustrated in FIG. 3B may be implemented through processing instructions executed on the processor 310, and in cooperation with other components illustrated in FIG. 3A, form an exemplary circuit test design system 350 on the exemplary data processing apparatus 300 illustrated in FIG. 3A.

The exemplary circuit test design system 350 includes a processing engine 360 to perform operations that, among other things, coordinate the interoperation of functional components, and to perform various computations. For example, the processing engine 360 may compute residue functions and determine therefrom an appropriate bit vector to assign to a particular gate.

The circuit test design system 350 may also include a database 380 to persistently store data corresponding to circuit elements and interconnections thereof that define one or more residue networks. The present general inventive concept is not limited by the format or specific content of the data stored in the database 380, and any suitable circuit data that can be manipulated through processing instructions on a processor, such as the processor 310, may be used with certain embodiments of the present general inventive concept.

The exemplary user interface 365 provides user access to the functions of the circuit design system 350. The user interface 365 may allow the user to place circuit components, to enter test design criteria, to manually perform operations, such as editing circuit data and test pattern lists, and assigning bit vectors to residue circuits when design system 350 is unable to make an assignment automatically, and other operations, such as to maintain and access a file system. The user interface 365 may be a graphical user interface; however, the present general inventive concept is not limited by the implementation details thereof.

As is illustrated in FIG. 3B, the exemplary circuit design system 350 includes a vector set generator 385 to generate the vector set 590 based on the maximum expected fan-in of the network, as described above. The vector set 590, once generated, may be stored in memory, such as data memory 344 or persistent storage 330. The present general inventive concept is not limited to the implementation details of the vector set generator 385, and such implementation details will be apparent to the skilled artisan from the descriptions herein.

The exemplary circuit design system 350 also includes a list manager 390. The exemplary list manager 390 maintains various vector lists, such as candidate assignment lists and unacceptable assignment lists, as will be described below. The list manager 390 may add and delete bit pattern entries from one or more lists as needed to practice the applicable embodiment of the present general inventive concept. The lists may be embodied as suitable data structures constructed in memory, such as in data memory 344 or persistent storage 330. Embodiments of the present general inventive concept are not limited to a particular list format, and various implementations of the list manager 390 will be apparent to the skilled artisan from the description below.

The circuit test design system 350 may also include a circuit object stack 370 to maintain data in a circuit tracing order, as will be apparent from the description below. The circuit object stack 370 may be a suitable data structure in memory to store data that identifies a circuit object, such as a gate, a network terminal, etc., in a manner that the object can be retrieved and stored in accordance with the order in which the object was removed from, herein referred to as "popped," or placed on, herein referred to as "pushed," the circuit object stack 370. For example, certain embodiments of the present general inventive concept implement a circuit tracing order that proceeds from a network output to a network input, i.e., backtracing, and a last-in first-out (LIFO) stack may be used as the circuit object stack 370 to maintain a processing order of the circuit objects in the backtracing order. The present general inventive concept is not limited by a particular stack construction, and multiple configurations may be used without departing from the spirit and intended scope of the present general inventive concept.

It is to be understood that in the descriptions that follow, various operations, such as backtracing, will be discussed as if the schematic diagram of the residue network were being traversed as an image. However, such description is to facilitate explanation of the present general inventive concept in a concise manner, and physical rendering of the schematic diagram as an image is not essential to practice the present general inventive concept. In certain embodiments of the present general inventive concept, the backtracing is achieved by retrieving data structures that contain information defining the circuit from the database 380, and manipulating, or performing computations on the data contained in the data structures. The present general inventive concept is not limited by the implementation details of manipulating circuit schematic data and the storage of that data and description thereof will be omitted in the interest of brevity.

An exemplary embodiment of the present general inventive concept will now be described per the general process flow illustrated in FIGS. 6A and 6B as performed on the circuit of FIG. 4. It is to be understood that the flowchart of FIGS. 6A and 6B illustrates an exemplary order of operations that may be used to practice the invention, but the present general inventive concept is not limited to the order in which the operations are illustrated and described.

Figure 4:
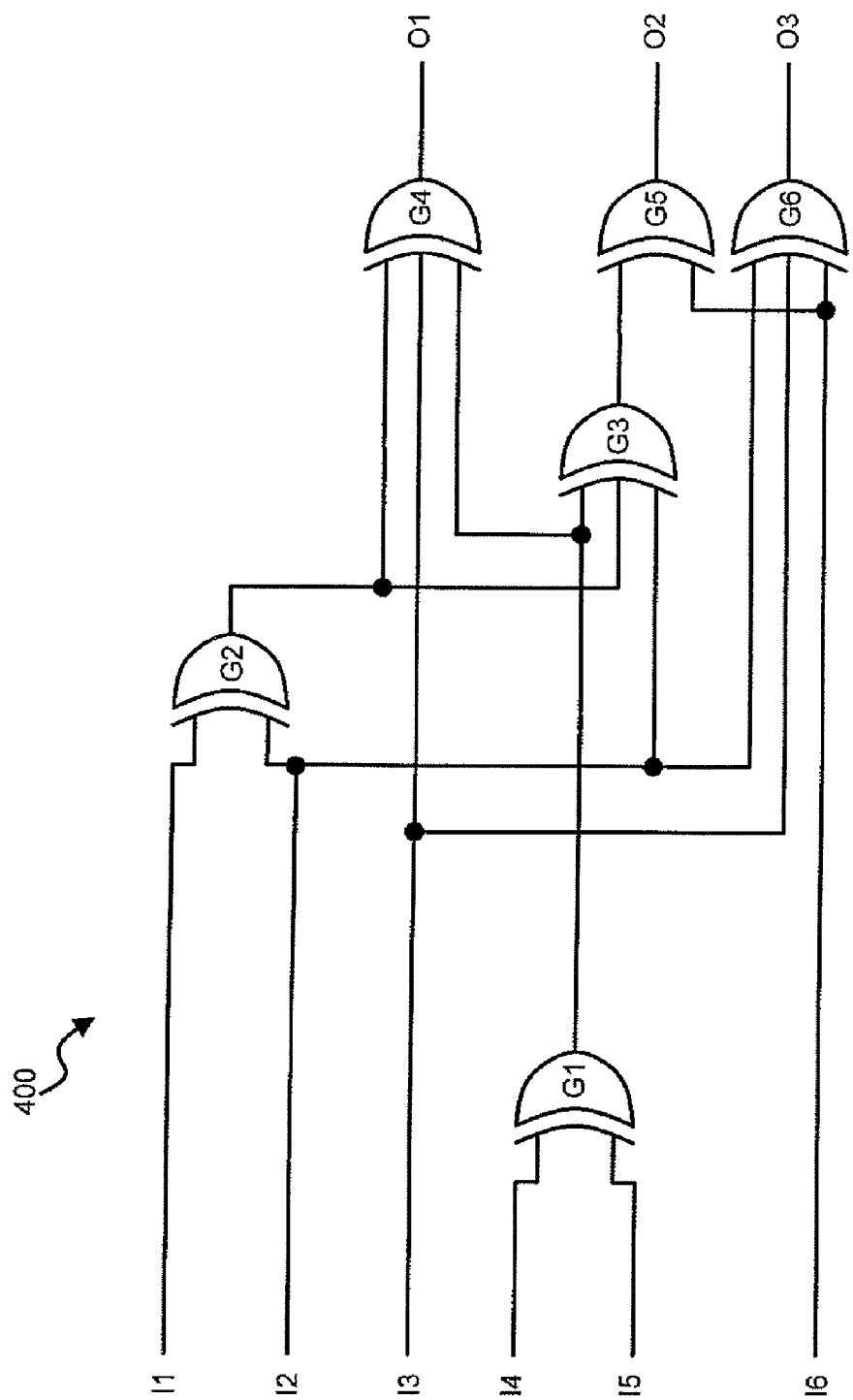
FIG. 4 is an XOR compression network to demonstrate an exemplary embodiment of the present general inventive concept.

The exemplary residue network of FIG. 4 is a simple implementation of a compressor circuit 400 using six (6) exclusive-or (XOR) gates G1-G6. In the interest of simplicity, the circuit 400 does not contain other circuit elements, such as buffers and inverters, but such gates within the circuit 400 may be processed according to the descriptions above. Further, it is to be understood that the XOR gates, which may be formed from combinations of AND, OR, NAND, NOR, and other gates, output a logic one (1) if an odd number of ones are provided to its input terminals, and logical zero (0) otherwise, in accordance with a modulo-2 sum residue function. It is to be noted that the fan-in of the XOR gates in circuit 400 varies from two (2) to three (3). Further, it is to be assumed that the vector set 590 has been generated according to a maximum expected fan-in of four (4) prior to the operations described below.

Figure 6A:
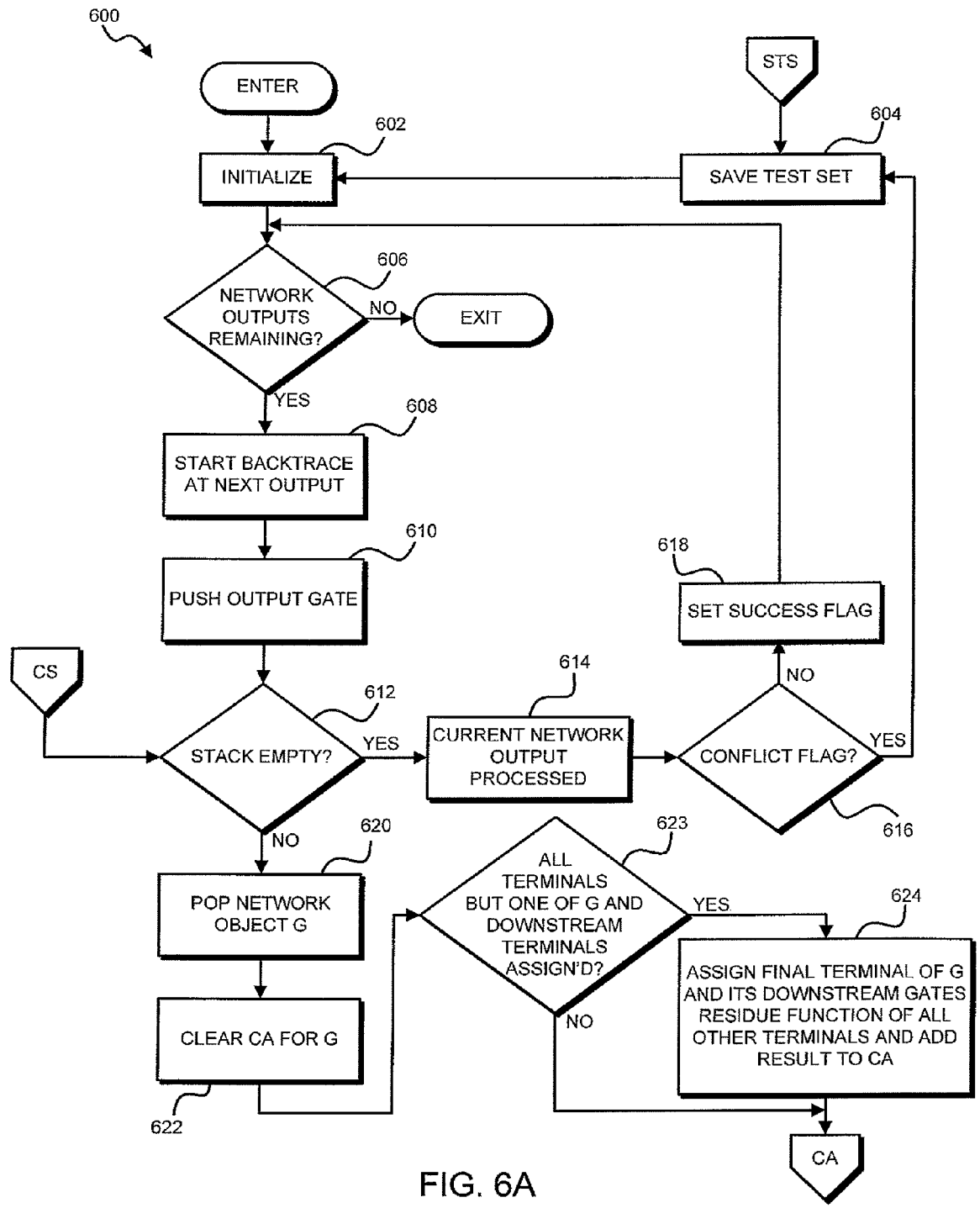
FIGS. 6A and 6B depict a flowchart to illustrate an exemplary process according to the present general inventive concept.
Figure 6B:
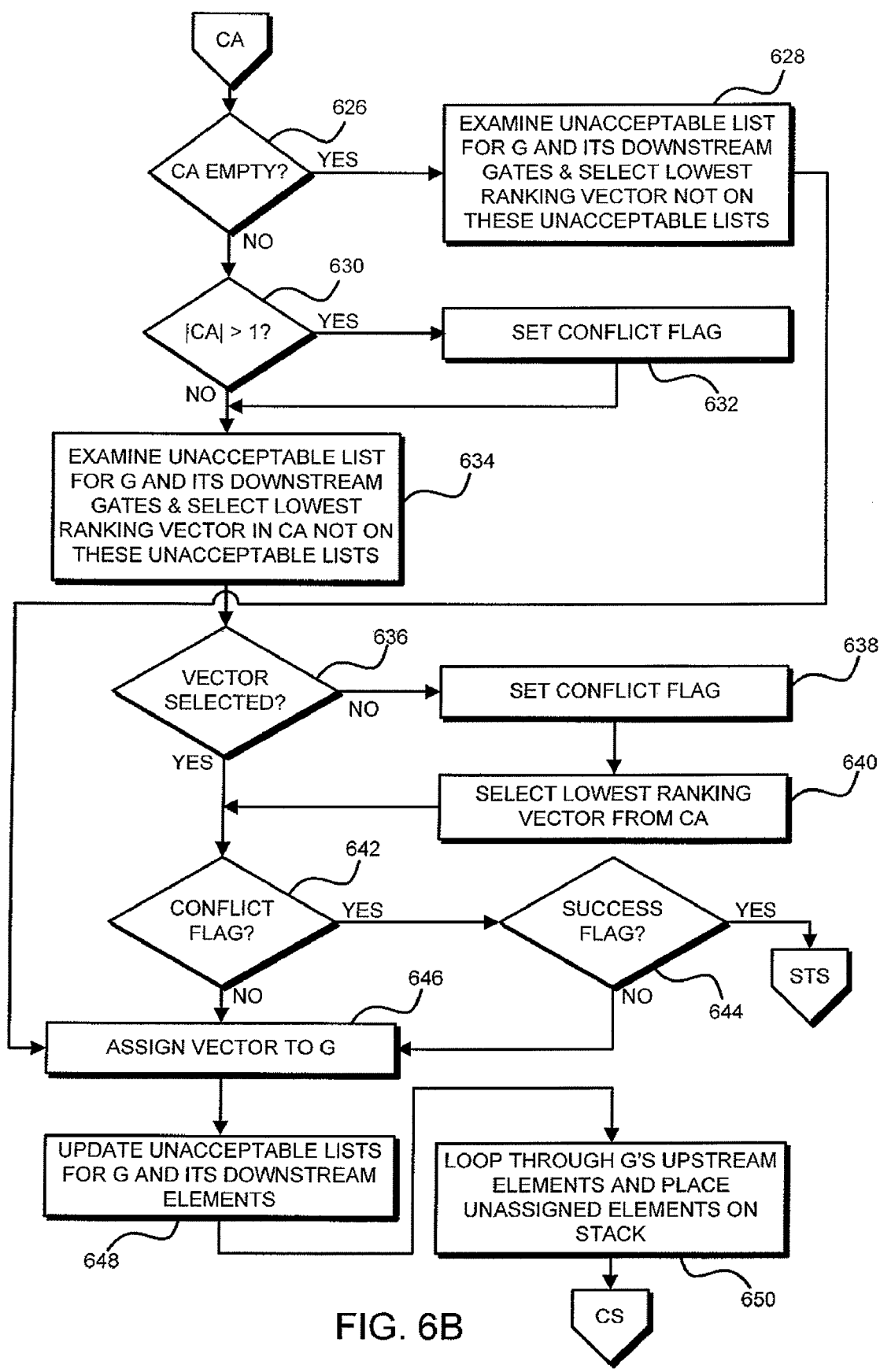

As illustrated in FIG. 6A, the exemplary process 600 is initialized to a predetermined initial state upon entry. For example, among other variables, status flags are reset, and all assignment lists are cleared. The process 600 then transitions to operation 606, where it is determined whether any outputs of the network have not been processed. If all network outputs have been processed, process 600 is exited. However, if it is determined that network outputs remain to be processed, the process 600 transitions to operation 608, whereby a next network output is selected.

Referring to FIG. 4, the output O1 is selected as the starting point for the first backtrace. The output O1 is the output terminal of gate G4, which according to operation 610, is pushed onto the stack. The process 600 then transitions to operation 612, whereby the stack is checked to determine whether it is empty. Since G4 is on the stack, the stack is not empty, and the process 600 transitions to operation 620, whereby G4 is popped from the stack. In operation 622, the candidate assignment (CA) list for the gate is cleared. The CA list is maintained to store vector assignments being considered for the terminals of the applicable gate.

The process 600 then transitions to operation 623, whereby it is determined whether only one terminal of the current gate G4 remains to be assigned. Since this is not the case, the process 600 transitions to operation 626, whereby it is determined whether the CA list for the present gate G4 is empty. Since no vector assignment has been made for gate G4, the process 600 transitions to operation 628, where the unacceptable list for G4 and its downstream gates, i.e., gates that are connected to the present gate's output terminal, are examined. The downstream gates will be alternatively referred to herein as "go-to" gates. In the present case, the unacceptable list for G4 is empty, and there are no downstream gates. The lowest ranking vector from the vector table is vector a, which is selected for gate G4. The process 600 proceeds to operation 646, whereby G4 is assigned the vector a, and, in operation 648, vector a is also added to G4's unacceptable list. Process 600 transitions to operation 650, whereby G4's upstream objects, i.e., circuit objects connected to the gate's inputs, also referred to herein as "come-from" objects, G2, I3, and G1, are pushed onto the stack.

The process 600 transitions to operation 612, whereby the stack is checked for the presence of any circuit objects. In the present state, the stack is not empty, and the process transitions to operation 620, whereby the last entry G1 is popped from the stack. The CA list is cleared for G1 in operation 622, and, omitting descriptions of operations already described, the process 600 transitions to operation 628. The unacceptable lists of G1 and its go-to gates G4 and G3 are scanned to find the first acceptable assignment for G1. Since vector a is the only vector on the unacceptable lists, vector b is assigned to G1 in operation 646, which is also added to G1's unacceptable list. In operation 648, vector b is XORed with each entry on the unacceptable lists of G3 and G4, G1's go-to gates, and the results are added to the gates' respective unacceptable lists. This results in an unacceptable list for G4 of {a, b, c} and an unacceptable list for G3 of {b}. G1's inputs, I4 and I5, are pushed onto the stack in operation 650.

The process 600 returns once again to operation 612, whereby it is determined that the stack is not empty. In operation 620, the last entry I5 is popped from the stack. Following the operations previously described, an assignment of vector a to I5 results, as well as an unacceptable list for G1 of {b, a, c}. I5 is an input to the XOR network, so nothing is added to the stack.

Proceeding along the same operations previously described, the last entry I4 is popped from the stack. However, at operation 623, it is determined that I4 is the only signal line connected to gate G1 that has not yet been assigned, and in operation 624, it is assigned vector c, the XOR of vectors a and b which are assigned to G1's other terminals. It is to be noted that vector c is on G1's unacceptable list, but the application of Rule 1 overrides Rule 2.

Returning to operation 620, the last entry I3 is popped from the stack. Following the same operations as above, the unacceptable lists of I3's go-to gates, G4 and G6, are examined to reveal that the only unacceptable vectors assigned are a, b, and c, on the list for G4. The next vector available is d, which is assigned to I3. Vector d is added to G6's unacceptable list, and XOR(d, a)=e, XOR(d, b)=f, XOR(d, c)=g, and vector d are added to G4's unacceptable list, which thereby becomes {a, b, c, d, e, f, g}.

The last entry G2 is popped from the stack in operation 620, which is the last connection to gate G4 to be processed. By Rule 1, G2 is assigned XOR(a, b, d)=g at operation 624, which is added to G2's unacceptable list in operation 648. Also, in operation 648, G3's unacceptable list is updated to become {b, g, e}, and objects I1 and I2 are pushed onto the stack in operation 650.

The last entry I2 is popped from the stack in the next iteration of operation 620, and vector a is assigned to I2. In operation 648, the unacceptable lists for I2's go-to gates, G2, G3, and G6 are updated to become, respectively, {g, a, f}, {b, g, e, a, c, d, f}, and {d, a, e}.

In the next iteration of process 600, the last entry I1 is popped from the stack. I1 is the last connection to gate G2 to be assigned, so it is assigned vector XOR(g, a)=f.

In the next iteration, it is determined at operation 612 that the stack is empty, so the test for the logic tree having G4 as its root is complete. The process 600 transitions to operation 614, whereby the output O1 is flagged as "processed." At operation 616 it is determined that the "conflict" flag, indicating that a residue function could not be resolved, is not set, so the "success" flag is set in operation 618. The process transitions to operation 606, and subsequently to operation 608, whereby the output O2 of the XOR network is chosen as the next starting terminal.

The processing of the remaining portions of circuit 400 proceeds in a manner similar to that described above. For purposes of brevity, the description of substantially similar operations as described above will be abbreviated, and the process will be described more fully where substantive differences are encountered. The abbreviated description will omit indication of the corresponding operations in FIGS. 6A-6B, whereas the description of the differences will indicate the corresponding operations in the flowchart.

Starting a new backtrace with G5, the unacceptable list thereof is examined whereby it is determined that the list is empty. Accordingly, vector a is assigned to gate G5, and is added to G5's unacceptable list. There are no go-to gates to process, and G5's inputs, G3 and I6, are pushed on the stack.

The last entry I6 is popped from the stack, and the unacceptable lists of its go-to gates G5 and G6, are examined. It is to be noted that the logic cones respectively containing G4 and G6 overlap, and thus certain terminals of G6 were assigned in the previous backtrace. Since the unacceptable lists G5 and G6 are, respectively, {a} and {d, a, e}, vector b, the lowest ranked vector not on these lists, is assigned to I6. G5's unacceptable list subsequently becomes {a, b, c}, and G6's unacceptable list becomes {d, a, e, b, f, c, g}.

The last entry G3 is then popped from the stack. All G3's inputs are already assigned, so G3 should be assigned XOR (b, g, a)=d, and accordingly the vector d is added to the CA list. However, the present assignment is also the last assignment to be made on the terminals of G3's go-to, G5. The other assignments on G5 are a, on G5's output, and b, on I6. So G3 should be assigned XOR(a, b)=c, and vector c is also added to the CA list. Thus, in operation 626, it is determined that the CA list is not empty, and in operation 630, it is determined that there is more than one candidate assignment in the CA list. Accordingly, a conflict exists at G3, and the conflict flag is set in operation 632. The process 600 transitions to operation 634, whereby the unacceptable lists of G3 and G5 are examined, and the lowest ranking vector in the CA list not on these lists is selected for G3, i.e. vector c, but since one successful backtrace has been completed (the one starting from G4), as indicated by the success flag and as determined in operation 644, the vector assignment is not made (operation 646 is bypassed). The resulting set of test patterns is saved in operation 604 as Test 1, where I1=f, I2=a, I3=d, I4=c, I5=a, I6=b.

In certain embodiments of the present general inventive concept, the test data are further reduced by truncating the test vectors of a saved test set to a length corresponding to the highest fan-in XOR gate processed for the test. In the current example, the highest fan-in encountered was three (3), so only the first 8 ($2^3$) elements of these vectors are saved for the test. Additionally, a pattern of all 0's may be appended to the test set to ensure that all signals undergo transitions both from 0 to 1 and from 1 to 0, which is useful for detecting dynamic defects. The first test set 710 of 9 patterns is shown in FIG. 7A.

The process 600 restarts at operation 602, where, after clearing all the assignments and unacceptable lists, a new backtrace is begun on the next uncompleted network output, which is G5. Since this backtrace begins in a cleared state, it would normally proceed without conflicts, similar to the case O1 case described above. However, the backtrace from G5 has reconvergent fan-out (there are two paths from I2 to G5). In certain embodiments of the present general inventive concept, the backtrace is not terminated upon encountering a conflict to attempt to start over again on G5, since this is the first backtrace for this new test set. Instead, once all network outputs have been processed, another complete pass starting at operation 602 may be conducted in which each gate not having a pattern set sufficient to perform an exhaustive test thereon is selected as a starting point for an additional backtrace. Note that this additional pass would be invoked only if reconvergent paths exist; otherwise the method described in the flowchart of FIGS. 6A-6B is guaranteed to produce an exhaustive test of each gate.

The backtrace from O2 proceeds in a manner similar to that described above; by assigning vector a to G5, adding vector a to G5's unacceptable list, and pushing G3 and I6 onto the stack.

I6 is popped from the stack, assigned vector b, and the unacceptable lists for I6, G5, and G6 are updated to become {b}, {a, b, c}, and {b}, respectively.

G3 is popped from the stack, assigned vector c according to Rule 1, and G1, G2, and I2 are pushed onto the stack.

I2 is popped from the stack, assigned vector a, vector a is added to gate G2's unacceptable list, and I2's, G2's, G3's, and G6's unacceptable lists are updated to {a}, {a}, {c, a, b}, and {b, a, c}, respectively.

G2 is popped from the stack, assigned vector d, G2's, G4's and G3's unacceptable lists are updated to {a, d, e}, {d}, and {c, a, b, d, g, e, f} respectively, and I1 is pushed onto the stack. (Input I2 is already assigned.)

I1 is popped from the stack and assigned vector e (Rule 1).

G1 is popped from the stack, assigned vector f (Rule 1), and I4 and I5 are pushed onto the stack.

I5 is popped from the stack and assigned vector a.

I4 is popped from the stack and assigned vector g (Rule 1).

At this point, the stack is empty, and the test for the logic cone having G5 as its root is complete. The reconvergent fan-out did not introduce a conflict in this case, and, as such, the next output, O3, is retrieved for processing.

G6 has two connections not yet assigned, its output and its input from I3. Its unacceptable list is {b, a, c}, so its output is assigned the vector d and I3 is pushed onto the stack.

I3 is then popped from the stack and assigned vector g (Rule 1).

The stack is empty, so the test for the current backtrace is complete, and there are no more outputs to process. All test sets for circuit 400 have been generated, and the second test set 720 is illustrated in FIG. 7B. Note that the generation of test set 720 also encountered a maximum XOR fan-in of three (3), and the patterns are truncated accordingly.

In the foregoing example, all inputs were assigned for each of the two test sets generated. Had that not been the case, the unassigned network inputs may be assigned arbitrarily chosen vectors from the first $2^n-1$ vectors of vector set 590, where n is the highest fan-in gate encountered during the generation of that test set.

In addition to the above, many other embodiments of the general inventive concept are possible. One such embodiment includes tracking which gates have an exhaustive test throughout the processing. A gate is deemed to have an exhaustive test if, for some test set, the residue function was resolved during processing of that test set and there was no conflict found on the gate for that test set. When all network outputs have been processed, another complete pass may be performed in which each untested gate (those not having an exhaustive test) is the starting point for the backtrace. Note that this additional pass would be invoked only if reconvergent paths exist; otherwise the method described in the flowchart of FIGS. 6A and 6B is guaranteed to produce an exhaustive test of each gate. When this additional pass is used, the upper bound on the number of test sets is no longer the number of network outputs, but depends also on the number of reconvergent paths.

It is to be understood that there are many ways in which the test patterns generated in accordance with the present general inventive concept may be used, including application on a general-purpose hardware tester, software simulation in an EDA environment, or by embedding the test patterns in a broader circuit design to be used in a suitable self-testing technique. As such, various pattern translations and conversions may be required to use the test patterns in any particular application. Even where the residue networks exemplified above are used, certain mappings may be required within the context of a broader circuit design of which the residue network is a part, and such mapping may possibly involve complex translations into an overall framework of the design. For example, when a residue network is to receive the test patterns generated in accordance with the present general inventive concept through other circuitry of the design framework, the test patterns may require conversion so that the test patterns may be injected at some specified location or locations in the framework and arrive at the residue network as designed. Similar conversions may be applied to ensure that the response data, as extracted at some specified location or locations in the design framework, correctly provides the operational status of the residue network. Such mappings may allow test patterns and the responses thereto to be conveyed through a test circuit, such as that illustrated in FIG. 1, whereby the scan chains 110-112 may convey in separate test cycles response data from the expansion network 120 and test patterns to the compression network 130. The present inventive concept is intended to embrace all such mappings and translations of test patterns generated in accordance therewith.

Additionally, it is to be understood that the test generation process may be divided into several distinct processes, such as the derivation of input stimuli to exercise the design sufficiently to evaluate it against some pre-established criteria, and calculating the expected response of the design to the generated input stimuli. There may be many other processes involved, such as calculating the completeness of the test relative to the pre-established criteria. The present inventive concept, while directed primarily towards the derivation of the input stimuli to exercise each residue gate exhaustively, may be used in conjunction with many processes to evaluate the residue network being tested therewith out deviating from the spirit and intended scope thereof.

Certain embodiments of the present general inventive concept provide for the functional components to manufactured, transported, marketed and/or sold as processor instructions encoded on computer-readable media. The present general inventive concept, when so embodied, can be practiced regardless of the processing platform on which the processor instructions are executed and regardless of the manner by which the processor instructions are encoded on the medium.

It is to be understood that the computer-readable medium described above may be any medium on which the instructions may be encoded and then subsequently retrieved, decoded and executed by a processor, including electrical, magnetic and optical storage devices, and wired, wireless, optical and acoustical communication channels. The computer readable medium may include either or both of persistent storage, referred to herein as "computer-readable recording media" and as spatiotemporal storage, referred to herein as "computer-readable transmission media". Examples of computer-readable recording media include, but are not limited to, read-only memory (ROM), random-access memory (RAM), and other electrical storage; CD-ROM, DVD, and other optical storage; and magnetic tape, floppy disks, hard disks and other magnetic storage. The computer-readable recording media may be distributed across components, to include such distribution through storage systems interconnected through a communication network. The computer-readable transmission media may transmit encoded instructions on electromagnetic carrier waves or signals, or as acoustic signals through acoustically transmissive media. Moreover, the processor instructions may be derived from algorithmic constructions of the present general inventive concept in various programming languages, the mere contemplation of which illustrates the numerous realizable abstractions of the present general inventive concept.

The descriptions above are intended to illustrate possible implementations of the present inventive concept and are not restrictive. Many variations, modifications and alternatives will become apparent to the skilled artisan upon review of this disclosure. For example, components equivalent to those shown and described may be substituted therefore, elements and methods individually described may be combined, and elements described as discrete may be distributed across many components. The scope of the invention should therefore be determined not with reference to the description above, but with reference to the appended claims, along with their full range of equivalence.

What is claimed is:

1. A method of generating test pattern sets to test a network of residue circuits, the method comprising:
    determining sets of bit vectors that resolve a residue function of respective residue circuits in a logic cone of a processor-readable representation of the network, the bit vectors containing bit patterns that combine to apply all input patterns to the respective residue circuits;
    assigning at least one vector of the resolved residue functions to one of the residue circuits in an overlapping logic cone of the network;
    propagating the bit vectors through the logic cone and the overlapping logic cone to the inputs of the network by resolving the residue function of intervening residue circuits with the vectors propagated thereto; and
    storing the bit vectors propagated to the inputs of the network as the test pattern sets.

2. The method of generating test pattern sets as recited in claim 1, wherein the propagating of the vectors includes:
    resolving the residue function of a first residue circuit having a first number of input terminals; and
    resolving the residue function of a second residue circuit having a second number of input terminals different from the first number of input terminals.

3. The method of generating test pattern sets as recited in claim 1, further comprising:
    establishing an ordered set of the bit vectors according to a maximum number of input terminals expected in the network; and
    selecting the bit vectors that resolve the residue function from the ordered set thereof in the bit vectors determining operation.

4. The method of generating test pattern sets as recited in claim 3, wherein the establishing of the ordered set comprises:
    generating a closed set of bit sequences such that the residue function of any distinct combination of the bit vectors between 2 and the maximum number of input terminals of the residue circuits in the network is a member of the closed set and exhaustively tests each of the residue circuits in the network.

5. The method of generating test pattern sets as recited in claim 1, further comprising:
    determining whether any of the residue circuits in the network could not be resolved with at least one of the bit vectors propagated thereto;
    storing the vectors propagated to the inputs of the network as one of the test pattern sets;
    assigning an alternative one of the bit vectors to an output of the network in the logic cone containing the residue circuit that could not be resolved with at least one of the bit vectors propagated thereto;
    propagating the alternative vector solutions through the logic cone and the overlapping logic cone to the inputs of the network by resolving the residue function of intervening residue circuits; and
    storing the alternative vectors at the inputs of the network as an additional test pattern.

6. The method of generating test pattern sets as recited in claim 1, further comprising:
    determining whether any of the residue circuits in the network could not be resolved with at least one of the bit vectors propagated thereto;
    assigning an alternative vector to the residue circuit that could not be resolved and resolving the residue function thereof with the alternative vector; and
    propagating the alternative vector solutions from the residue circuit that could not be resolved through the logic cone and the overlapping logic cone to the inputs of the network by resolving the residue function of intervening residue circuits; and
    storing the alternative vectors at the inputs of the network as an additional test pattern set.

7. The method of generating test pattern sets as recited in claim 1, further comprising:
    truncating the vectors in the test pattern sets to a bit length corresponding to the maximum number of input terminals from among the residue circuits included in the test pattern set.

8. The method of generating test pattern sets as recited in claim 1, further comprising:
    retrieving the test pattern set from storage; and
    applying the test pattern set to a residue network.

9. A test circuit having stored in state retention cells thereof the test patterns generated in accordance with the method of claim 1.

10. A test circuit having stored in state retention cells thereof respective outputs of the residue function applied to the test patterns generated in accordance with the method of claim 1.

11. A computer readable medium having encoded thereon processor instructions that, when executed by a processor, performs the method of claim 1.

12. A method of generating test pattern sets to test a network of gates respectively performing a residue function of bits applied to input terminals thereof, the method comprising:
- generating a set of bit vectors to apply to input terminals of the network such that every gate in logic cones thereof is driven by all possible input values, where at least one of the gates in the network has a number of input terminals different from another one of the gates;
- assigning one of the bit vectors to an output of the network and resolving the residue function of the gate connected thereto with the assigned one of the bit vectors;
- propagating the bit vectors resolved at the output gate to the gates respectively connected thereto and resolving the residue function of the connected gates using the bit vectors propagated thereto;
- repeating the propagating of the bit vectors to, and the resolving of the residue functions of gates coupled to the output gate to assign input bit vectors to the input terminals of the network; and
- storing the input bit vectors as one of the test pattern sets.

13. The method of generating test pattern sets as recited in claim 12, further comprising:
- determining whether any of the gates in the network could not be resolved with at least one of the bit vectors propagated thereto;
- storing the vectors propagated to the inputs of the network as one of the test pattern sets;
- assigning one of the bit vectors to another output of the network and resolving the residue function of the gate connected thereto with the assigned one of the bit vectors;
- propagating the bit vectors resolved at the other output gate to the gates respectively connected thereto and resolving the residue function of the connected gates using the bit vectors propagated thereto;
- repeating the propagating and the resolving to assign other input bit vectors to the input terminals of the network; and
- storing the other input bit vectors as another one of the test pattern sets.

14. The method of generating test pattern sets as recited in claim 12, further comprising:
- determining whether any of the gates in the network could not be resolved with at least one of the bit vectors propagated thereto due to a reconvergent fan-out of a gate within the network;
- assigning an alternative vector to the gate that could not be resolved and resolving the residue function thereof with the alternative vector; and
- propagating the bit vectors resolved at the previously unresolvable gate to the gates respectively connected thereto and resolving the residue function of the connected gates using the bit vectors propagated thereto;
- repeating the propagating and the resolving to assign other input bit vectors to the input terminals of the network; and
- storing the other input bit vectors as another one of the test pattern sets.

15. The method of generating test pattern sets as recited in claim 12, wherein the propagating of the vectors includes:
- resolving the residue function of a gate having at least one of the bit vectors being propagated thereto from a logic cone that overlaps with the logic cone containing the gate.

16. The method of generating test pattern sets as recited in claim 12, wherein the generating of the set of bit vectors includes:
- generating an ordered set of bit sequences based on the maximum number of terminals of the gates in the network such that any two vectors applied to a two-input gate exhaustively test the gate;
- augmenting the ordered set with bit vectors resulting from performing the residue function on any number of the bit vectors between 2 and the maximum number of input terminals of gates in the network; and
- repeating the augmenting until a field of the bit vectors is obtained such that the residue function of any distinct combination of the bit vectors between 2 and the maximum number of input terminals of the gates in the network results in a member of the field.

17. The method of generating test pattern sets as recited in claim 16, wherein each test pattern set is appended with a pattern of all zeros to ensure that transitions from logical 0 to logical 1 and from logical 1 to logical 0 occur on every input.

18. The method of generating test pattern sets as recited in claim 16, further comprising:
- truncating the vectors in the test pattern sets to a bit length corresponding to the maximum number of input terminals from among the gates respectively included in the test pattern sets.

19. A circuit test design apparatus to generate test patterns to test residue networks comprising:
- a database to store a processor-readable representation of the residue network;
- a vector set generator to generate an ordered set of bit vectors according to a maximum number of input terminals expected in the residue network;
- a storage unit to store therein the bit vectors; and
- a processor to:
  - determine sets of bit vectors that resolve a residue function of respective residue circuits in a logic cone of the processor-readable representation of the network;
  - assign at least one vector of the resolved residue functions to one of the residue circuits in an overlapping logic cone of the network;
  - propagate the bit vectors through the logic cone and the overlapping logic cone to the inputs of the network by resolving the residue function of intervening residue circuits with the vectors propagated thereto; and
  - store the bit vectors propagated to the inputs of the network in the storage unit as the test pattern sets.

20. The circuit test design apparatus as recited in claim 19 further comprising:
- a circuit object stack to maintain a set of circuit objects in an order in which the circuit objects are encountered during the bit vector propagation by the processor.

21. The circuit test design apparatus as recited in claim 19 further comprising:
- a list manager to maintain a list of unacceptable bit vector assignments in memory as the residue functions are resolved, the unacceptable bit vector assignments including bit vectors that do not resolve the residue function of a gate given the bit vectors assigned to the gate.

22. A test circuit to test a functional circuit, the test circuit comprising:
- a residue network to produce a plurality of bit patterns according to residue circuits thereof; and
- a plurality of scan chains embedded in the functional circuit and coupled to the residue network, the scan chains having stored therein bit patterns corresponding to a functional test of the residue network performed separately from the test of the functional circuit.

23. The test circuit as recited in claim 22, wherein the bit patterns stored in the scan chains belong to a closed set of test patterns to apply to the residue network, the set of test patterns when combined each with at least another thereof exhaustively forms all combinations of inputs to each of a set of the residue circuits in the residue network.

24. The test circuit as recited in claim 23, wherein at least one of the residue circuits has a number of input terminals other than a number of input terminals of another of the residue circuits.

25. The test circuit as recited in claim 23, wherein an output of one of the residue circuits is coupled to another of the residue circuits through at least two separate interconnection paths.

26. The test circuit as recited in claim 22, wherein the bit patterns stored in the scan chains are produced by the residue network in response to test patterns applied thereto, the test patterns belonging to a closed set thereof that in combination each with at least another exhaustively forms all combinations of inputs to each of a set of the residue circuits in the residue network.

27. The test circuit as recited in claim 26, wherein at least one of the residue circuits has a number of input terminals other than a number of input terminals of another of the residue circuits.

28. The test circuit as recited in claim 26, wherein an output of one of the residue circuits is coupled to another of the residue circuits through at least two separate interconnection paths.

* * * * *